United States Patent
Eshima

(10) Patent No.: US 7,448,011 B2
(45) Date of Patent: Nov. 4, 2008

(54) LAYOUT METHOD OF SEMICONDUCTOR INTEGRATED CIRCUIT AND CELL FRAME STANDARDIZATION PROGRAM

(75) Inventor: Takashi Eshima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/237,741

(22) Filed: Sep. 29, 2005

(65) Prior Publication Data

US 2006/0236282 A1 Oct. 19, 2006

(30) Foreign Application Priority Data

Mar. 17, 2005 (JP) .............................. 2005-078188

(51) Int. Cl.
*G06F 17/50* (2006.01)
(52) U.S. Cl. ................................ 716/10; 716/6; 716/13
(58) Field of Classification Search ................ 716/1–18
See application file for complete search history.

(56) References Cited

U.S. PATENT DOCUMENTS

| | | | | |
|---|---|---|---|---|
| 5,459,673 A * | 10/1995 | Carmean et al. ................ | 716/6 |
| 5,663,662 A * | 9/1997 | Kurosawa ..................... | 326/41 |
| 6,093,214 A * | 7/2000 | Dillon ......................... | 716/17 |
| 6,324,671 B1 * | 11/2001 | Ratzel et al. ................... | 716/1 |
| 6,487,702 B2 * | 11/2002 | Lin et al. ....................... | 716/4 |
| 6,516,456 B1 * | 2/2003 | Garnett et al. ................. | 716/8 |
| 6,574,786 B1 * | 6/2003 | Pohlenz et al. ................ | 716/17 |
| 6,591,407 B1 * | 7/2003 | Kaufman et al. .............. | 716/10 |
| 6,593,792 B2 * | 7/2003 | Fujii .......................... | 327/276 |
| 6,606,736 B1 * | 8/2003 | Kobayashi et al. ............ | 716/10 |
| 6,691,294 B2 * | 2/2004 | Law ............................ | 716/11 |
| 6,748,579 B2 * | 6/2004 | Dillon et al. .................. | 716/19 |
| 6,904,581 B1 * | 6/2005 | Oh ............................. | 716/10 |
| 6,978,431 B2 * | 12/2005 | Hirakimoto et al. ........... | 716/10 |
| 7,137,094 B2 * | 11/2006 | Tien ............................ | 716/11 |
| 7,208,350 B2 * | 4/2007 | Kawashima et al. ........ | 438/129 |
| 7,260,803 B2 * | 8/2007 | Lakshmanan et al. ......... | 716/10 |
| 7,272,809 B2 * | 9/2007 | Becker et al. ................. | 716/10 |
| 2004/0064800 A1 * | 4/2004 | Korobkov .................... | 716/10 |
| 2005/0044522 A1 * | 2/2005 | Maeda ........................ | 716/18 |
| 2005/0108671 A1 * | 5/2005 | Becker et al. ................. | 716/10 |
| 2006/0015835 A1 * | 1/2006 | Huang et al. .................. | 716/8 |
| 2007/0038968 A1 * | 2/2007 | Braun et al. .................. | 716/2 |
| 2007/0061769 A1 * | 3/2007 | Kumagai ..................... | 716/13 |
| 2007/0130552 A1 * | 6/2007 | Inoue .......................... | 716/10 |
| 2007/0150849 A1 * | 6/2007 | Haruki ........................ | 716/17 |

FOREIGN PATENT DOCUMENTS

| | | |
|---|---|---|
| JP | 8-181216 | 7/1996 |
| JP | 2003-282711 | 10/2003 |

* cited by examiner

*Primary Examiner*—Paul Dinh
*Assistant Examiner*—Patrick Sandoval
(74) *Attorney, Agent, or Firm*—Staas & Halsey LLP

(57) ABSTRACT

Cells with the same logic and similar driving capability among cells arranged on a substrate of a semiconductor integrated circuit are made into a format comprising terminals at the same position in the same-sized cell frame, and within cells in such a format, by arranging other cells in a redundant region of cell frame in a cell with low driving capability, wiring modification operation is reduced in layout of a semiconductor integrated circuit and efficiency of circuit design is improved, preventing chip size from being redundantly large.

10 Claims, 21 Drawing Sheets

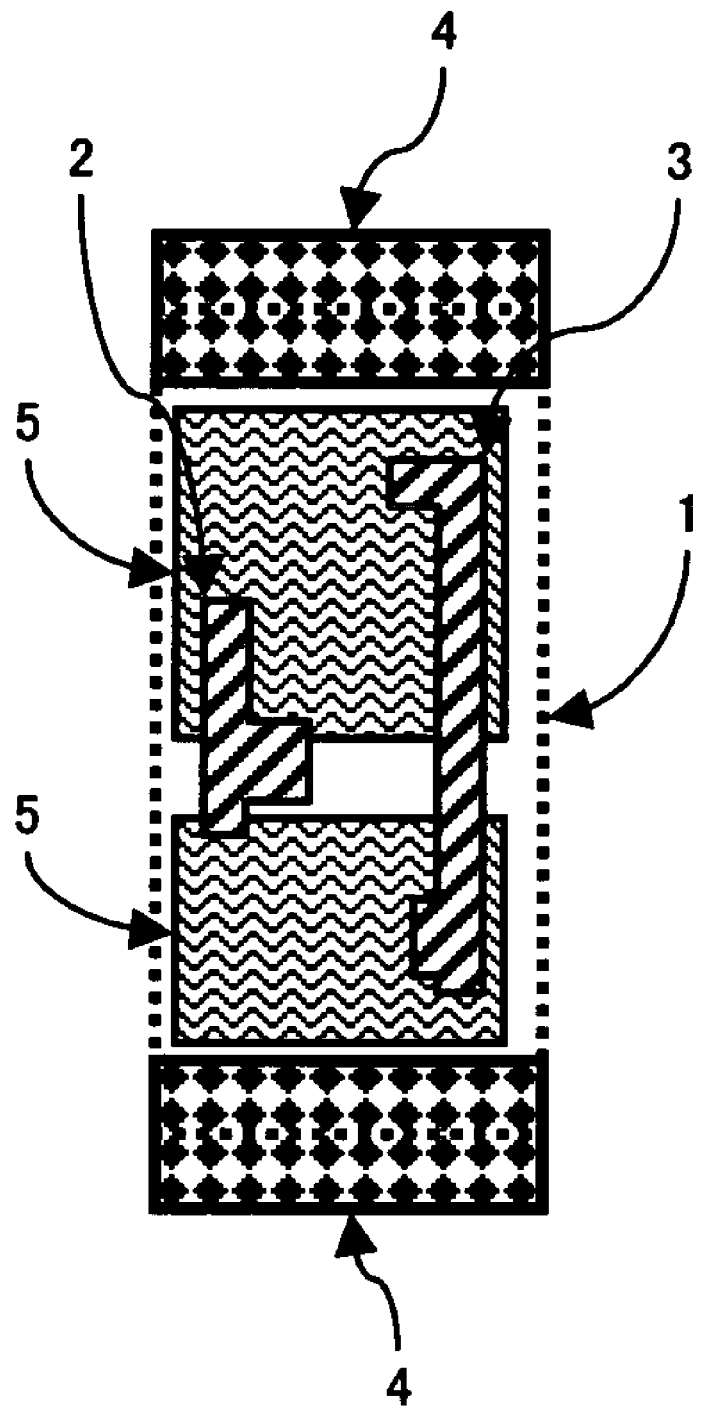
F I G. 2

CELL WIDTH: DRIVING CAPABILITY LINEUP

2 μm : x1、x2

4 μm : x1、x2、x4

8 μm :      x2、x4、x8

12 μm :           x4、x8、x12

16 μm :                x8、x12、x16

32 μm :                     x12、x16、x32

F I G. 3

CELL WIDTH: DRIVING CAPABILITY LINEUP

8μm : x1、 x2、 x4、 x8

32μm :                              x12、x16、x32

F I G.  4

CELL WIDTH: DRIVING CAPABILITY LINEUP

```
#CELL LIBRARY
MACRO {NEW CELL NAME 1}
   SIZE XXX YYY;
   PINSTYLE A;
   PIN INPUT TERMINAL NAME COORDINATE;
   PIN OUTPUT TERMINAL NAME COORDINATE;
   PIN POWER TERMINAL NAME COORDINATE;
END MACRO
```

F I G. 1 0

```
#CELL LIBRARY
MACRO {NEW CELL NAME 1}
   SIZE XXX YYY;

PIN INPUT TERMINAL NAME  COORDINATE;
   PIN OUTPUT TERMINAL NAME COORDINATE;
   PIN POWER TERMINAL NAME  COORDINATE;
END MACRO
```

FIG. 11

```
#TERMINAL SHAPE TABLE
{NEW CELL NAME 1}: PINSTYLE A;
{NEW CELL NAME 2}: PINSTYLE A;
{NEW CELL NAME 3}: PINSTYLE B;
```

FIG. 12

```
#CELL LIBRARY
MACRO {NEW CELL NAME 1}
   SIZE XXX YYY;
   DIVCELL {ORIGINAL CELL NAME 1} COORDINATE
            BULKCELLA COORDINATE;
   PIN INPUT TERMINAL NAME  COORDINATE;
   PIN OUTPUT TERMINAL NAME COORDINATE;
   PIN POWER TERMINAL NAME  COORDINATE;
END MACRO
```

FIG. 13

```
#CELL LIBRARY
MACRO {NEW CELL NAME1}
   SIZE  XXX YYY;

PIN INPUT  TERMINAL  NAME  COORDINATE;
   PIN OUTPUT TERMINAL NAME COORDINATE;
   PIN POWER  TERMINAL NAME  COORDINATE;
END MACRO
```

FIG. 14

TABLE OF CELL AFTER SEPARATION
{NEW CELL NAME 1}: {ORIGINAL CELL NAME 1} BULKCELLA;
{NEW CELL NAME 2}: {ORIGINAL CELL NAME 2} BULKCELLA;
{NEW CELL NAME 3}: {ORIGINAL CELL NAME 3} BULKCELLB;

LAYOUT METHOD OF SEMICONDUCTOR INTEGRATED CIRCUIT AND CELL FRAME STANDARDIZATION PROGRAM

CROSS-REFERENCE TO RELATED APPLICATIONS

This application is based upon and claims the benefit of priority from the prior JAPANESE Patent Application No. 2005-078188 filed on Mar. 17, 2005, the entire contents of which are incorporated herein by reference.

BACKGROUND OF THE INVENTION

1. Field of the Invention

The present invention relates to a semiconductor integrated circuit with cells arranged on a semiconductor substrate and with wiring for the cells, and more specifically to a semiconductor integrated circuit, a cell library and a cell frame standardization program, which reduces operation of replacing a cell, arranged after cell layout, by a cell with the same logic but a different driving capability.

2. Description of the Related Art

In designing a semiconductor integrated circuit of interest in the present invention, arrangement, or layout, of a plurality of cells on a semiconductor substrate is carried out and a semiconductor integrated circuit as a chip is produced. In the layout operation of cells on the chip, first, cells are arranged, while the estimation to prevent timing error is carried out, and wiring between cells is performed.

Later, capacitance between wiring and wiring resistance on the chip is extracted, the amount of signal delay is calculated, and timing error is examined. When the timing error is detected, in order to modify layout, a process of replacing the arranged cell with a cell with the same logic but different driving capability is carried out.

The cells with different driving capabilities are not made to have the same cell size and the terminals are not at the same position though they have the same logic in general. For that reason, when replacing a cell with a cell with high driving capability, or a cell with a large cell size generally, many of those cases require moving of the cell. When moving the cell, or when, though not moving, positions of terminals in the cells are different, it is required to modify wiring connected to the terminals. Then, operation of re-extraction of capacitance between wirings and wiring resistance is required when modifying the wiring. Here, problems raise that operations such as modification of wiring and re-extraction of wiring resistance takes a lot of time, and that the amount of operations for timing error correction increases.

The followings are reference documents of prior technology relating to such designing of a semiconductor integrated circuit and its layout. Patent Document 1: Japanese laid-open disclosure public patent bulletin No. 08-181216 "Library Group and Semiconductor Integrated Circuit Using Library Group" Patent Document 2: Japanese laid-open disclosure public patent bulletin No. 2003-282711 "Semiconductor Integrated Circuit and its Designing Method"

Patent Document 1 describes a technology in which a basic cell is configured by transistors with narrow channel width, providing a library group of functional block and logical gates, which allows designing without re-arrangement, re-wiring or modification of logical gates by making logical gates with the same logic function but different load driving capabilities and position of input/output terminals of a functional block the same.

Patent Document 2 discloses a semiconductor integrated circuit in which function cells are comprised of buffers and inverter cells, when arranging the function cells, the function cells are arranged by making cell size look artificially larger, regions of a wiring prohibiting region etc. are provided on a differential region between the actual cell size of the function cell and the sell size which is made to look artificially larger, and regardless of high or low driving capability, the same logic function cell has a structure of the same size and the same input and output terminal position.

In the above conventional technologies, in order to reduce operation for modifying wiring or re-extracting wiring resistance etc., a method, for making cell size and terminal position the same for cells with the same logic function but different driving capabilities, is employed. However, the range of the driving capability of the cell with the same logic is wide in general. Then, it is an insoluble problem that, when cell size and terminal position are made the same for all cells with the same logic within the range, the cell size becomes extremely large as a result, and chip size also becomes redundantly large. As the chip size becomes large, manufacturing cost rises, and from that point also, it is a problem to be solved to make cell size and terminal position the same for all cells with the same logic.

SUMMARY OF THE INVENTION

It is an object of the present invention to prevent chip size from being redundantly large, to reduce wiring modification operation in layout of a semiconductor integrated circuit and to improve efficiency of circuit design by making cell size and terminal position the same between cells with the same logic and similar driving capability.

In the present invention, the cells with the same logic and similar driving capability among the cells arranged on a substrate of a semiconductor integrated circuit are made into a format so as to have terminals at the same position in the same-sized cell frame. In a redundant region of a cell frame of a cell with low driving capability among the cells in the above format, other cells are arranged.

According to the present invention, by making cell size and positions of terminals the same for cells with the same logic and similar driving capability, that is cells with its driving capability falls within a certain range, modification of wiring and re-extraction operation of capacitance between wiring and wiring resistance in layout of a semiconductor integrated circuit can be reduced, chip size is protected from being redundantly large, and the present invention greatly contributes to promotion of designing efficiency of semiconductor integrated circuits.

BRIEF DESCRIPTION OF THE DRAWINGS

FIG. 2 describes a practical example of a cell with the lowest driving capability;

FIG. 3 is an explanatory diagram of a first example of driving capability lineup of cells for each cell width;

FIG. 4 is an explanatory diagram of a second example of driving capability lineup for each cell width;

FIG. 5 is an explanatory diagram of a third example of driving capability lineup for each cell width.

FIG. 10 is an explanatory diagram of a new cell library containing terminal shape data;

FIG. 11 is an explanatory diagram of another example of a new cell library;

FIG. 12 is an example of terminal shape table relating to the cell library in FIG. 11;

FIG. 13 is an example of a new cell library containing data of a cell inserted in a redundant region;

FIG. 14 is an explanatory diagram of a different example of a new cell library containing data of a cell inserted in a redundant region;

FIG. 15 is an example of table of a cell after separation relating to the cell library in FIG. 14;

DESCRIPTION OF THE PREFERRED EMBODIMENT

Figure 1A:
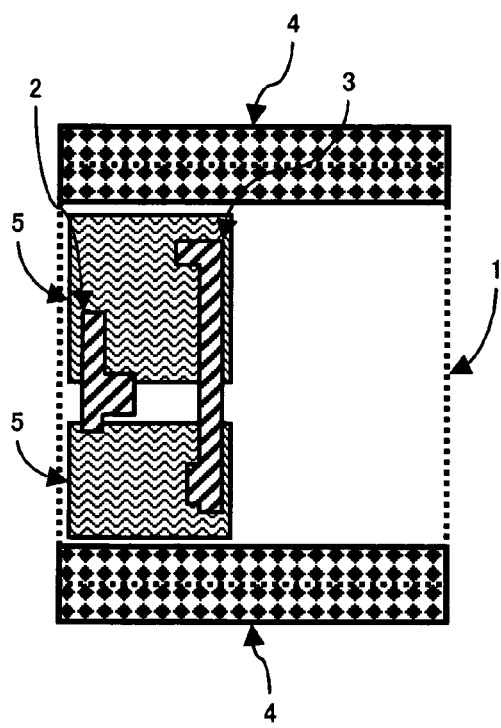
FIG. 1a and FIG. 1b are explanatory diagrams of a practical example of a cell with terminals at the same position in the same-sized cell frame in the present invention.
Figure 1B:
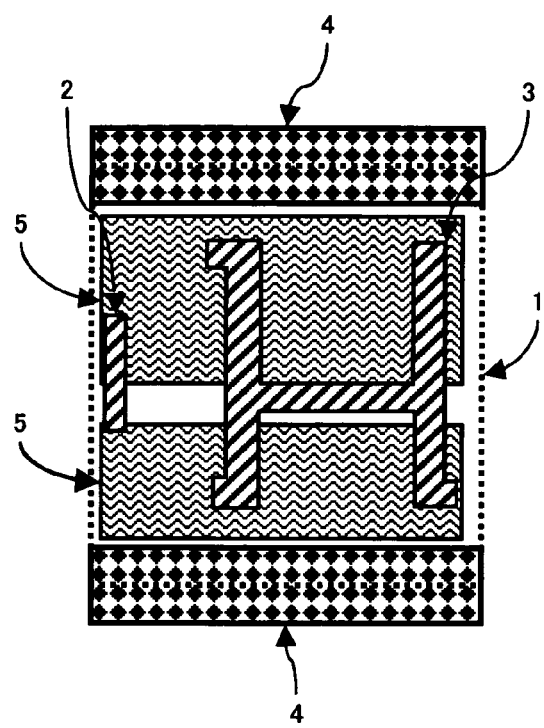

FIG. 1a and FIG. 1b are basic explanatory diagrams of a cell in the semiconductor integrated circuit of the present invention. The semiconductor integrated circuit of the present invention is a semiconductor integrated circuit with cells arranged on a substrate, and is a semiconductor integrated circuit in which, among the cells arranged on the substrate, cells with the same logic and similar driving capability have terminals at the same position in a same-sized cell frame.

In FIG. 1a and FIG. 1b, cells with different driving capabilities in the same cell frame are shown. In other words, cells, comprising an input terminal 2 and an output terminal 3 in the format that they are between two power terminals 4 in the same-sized cell frame 1, are shown. In FIG. 1a and FIG. 1b, the input terminals 2 have virtually identical design; however the output terminal 3 in FIG. 1b has H-shaped structure. Because the terminal comprises a part in the same position as the output terminal 3 in FIG. 1a, the cell in FIG. 1a can be replaced by FIG. 1b without modification of wiring and vice versa, if wiring is performed to the common part.

A cell library of the present invention is a library of cells arranged on a semiconductor integrated circuit substrate, and is a cell library for storing data, which indicates that a cell has terminals at the same position in the same-sized cell frame, to the cells with the same logic and similar driving capability.

The cell library of the present invention stores data indicating cells inserted in a redundant region of a cell comprising a redundant region within its cell frame among the cells with terminals at the same position in the same-sized cell frames and with the same logic and similar driving capabilities.

Next, the cell frame standardization program of the present invention is a program for the cells arranged on a substrate of a semiconductor integrated circuit, and it is for causing a computer to perform a procedure for reading layout information of each of the cells with the same logic and similar driving capability, a procedure for creating standard cell frame to match the size of the largest cell of the cells, and a procedure for outputting the position of where terminal shape of each cell overlaps as a common position of terminals. Also, computer-readable portable storage media storing the cell frame standardization program is used as a storage media.

As described above, according to the present invention, among cells to be arranged on a substrate of a semiconductor integrated circuit, it is possible to arrange the cells with the same logic and similar driving capability so that those cells have terminals at the same position in the same-sized frame.

The present invention is to reduce operations such as re-extracting wiring resistance and modification of wiring in cell layout by making the cell size and position of terminals the same between cells with the same logic but different driving capability. However, driving capability of cells generally has a wide range, and thus, cell size become larger as driving capability increase. When cell size is made the same independently of driving capability, chip size becomes extremely and redundantly large. In order to prevent the problem, in the present embodiment, cell size and position of terminals are made the same only between the cells with similar driving capability.

Here, base driving capability, for example a cell with minimum driving capability, is represented by x1, and a cell with the same logic and its driving capability of n times as much as the cell with minimum driving capability is represented by xn. FIG. 2 describes an example of a cell x1 with base driving capability.

Suppose that there is a lineup of x1, x2, x4, x8, x12, x16 and x32 as the lineup of cell driving capability. Cell height, which is the vertical dimension of the cell, of each driving capability is the same while cell width, which is the horizontal dimension of the cell, would be 2 μm for cells of driving capability x1 and x2, 4 μm for x4 cells, 8 μm for x8 cells, 12 μm for x12 cells, 16 μm for x16 cells and 32 μm for x32 cells. The cell width of the cell of driving capability x1 and that of the cell of driving capability x32 are substantially different, and in order to make the cell size of those two the same, the cell of driving capability x1 would have to have a large redundant region.

In the view of the problem, the present embodiment prevents cell size from being too redundantly large by making the cell size and position of terminals the same among the cells with the same logic and similar driving capability. FIG. 3 is an explanatory diagram of a first example of a driving capability lineup of cells with the same cell width. In the first example, cells with any driving capability are made in a plurality of widths. For example, the cells of driving capability x1 are made from two widths, 2 μm and 4 μm, the cells of driving capability x2 are made from three widths, 2 μm, 4 μm and 8 μm.

FIG. 4 shows a second example of a driving capability lineup and the cell width. In the second example, it is assumed that cells of a certain driving capability are made with only one width: the cell width of driving capability of x1 through x8 is 8 μm and the cell width of driving capability of x12 through x32 is 32 μm.

FIG. 5 is a third example of a driving capability lineup and cell widths. In the third example, each cell is made so as to have a width for making all cell sizes the same, or to have minimum width. For example, the cell of driving capability x1 is made in the width of 2 μm and 8 μm, and the cell of driving capability x8 is made in the width of 8 μm.

As described above, in the present embodiment, cells with similar driving capability have the same cell size, that is cell width, in common. In an actual cell layout, it rarely happens that the cell of the minimum driving capability x1 is replaced with the cell of the maximum driving capability x32, and even if number of the cell widths generated for each driving capability is limited, modification efficiency of the layout is not drastically reduced. If it is inappropriate to have a redundant region in a chip, as in the third example in FIG. 5, for example, by preparing cells without redundant width as well as cells with redundant width, layout flexibility can be increased. It is possible to replace the cell with the cell having no redundant region in the stage that driving capability of each cell is mostly determined. The position of terminals in this case, is assumed to be the same.

Figure 6:
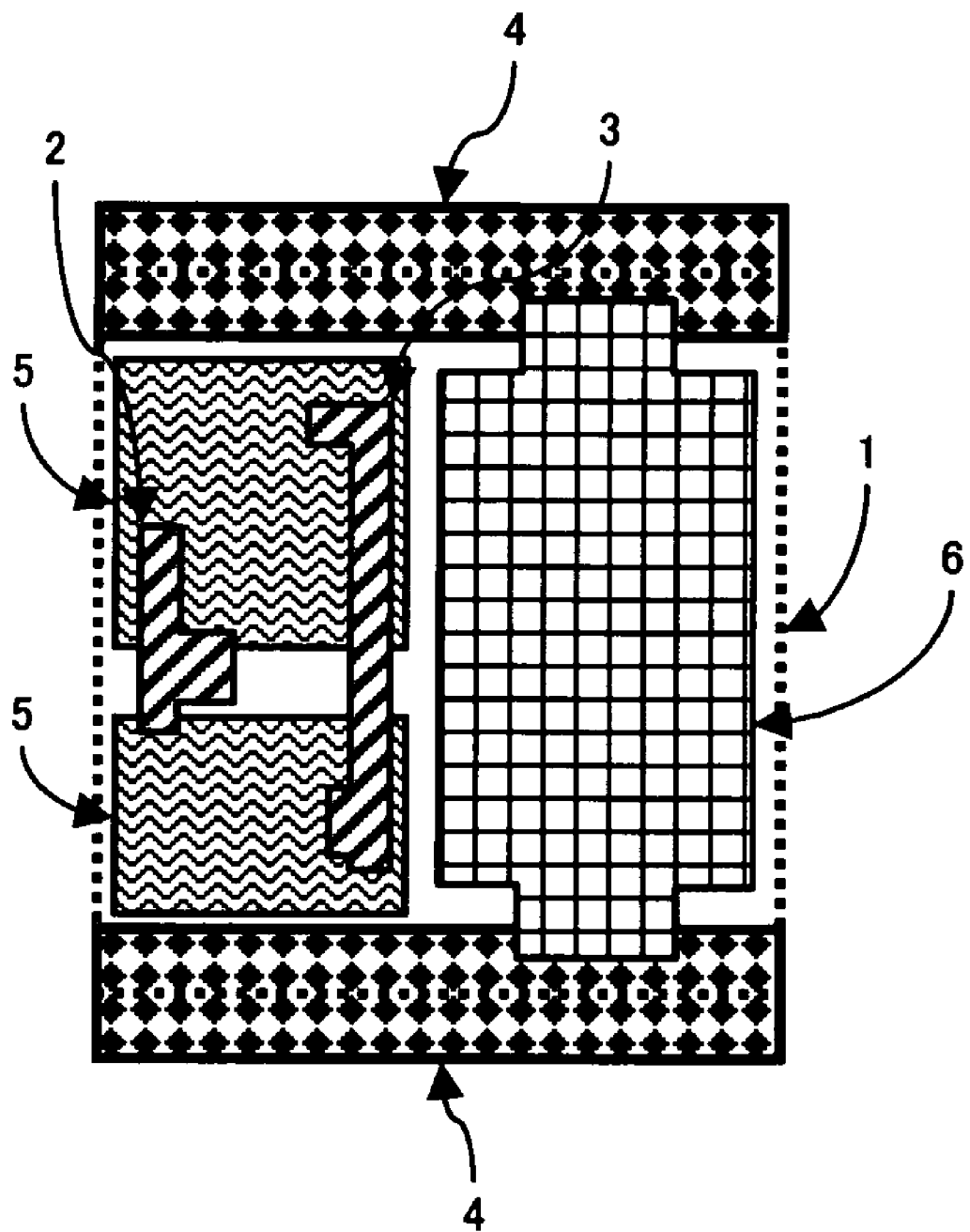
FIG. 6 is an explanatory diagram of example of inserting other cells in the redundant region.

When a size of a cell of low driving capability is made to be a size of another cell of high driving capability, the cells of low driving capability are expected to have a redundant region as shown in FIG. 1a. As shown above, by inserting cells into the redundant region generated in a cell, it is possible to utilize the redundant region effectively. FIG. 6 is an example of a cell with capacitance between power sources inserted in such a redundant region. In FIG. 6, capacitance between power sources is inserted into the redundant region as the other cell 6.

As a cell inserted to such a redundant region, besides capacitance between power sources, a bulk cell usable in layout modification can be also inserted. Such a bulk cell is hereinafter referred to as engineering change (EC) bulk. In addition, it is possible to insert a cell of capacitance between power sources, which can be converted for an EC bulk in the redundant region. When such an EC bulk cell is inserted, in order to utilize the cell for the purpose of layout modification, it is required to separate a cell name in order to separate logic cell and EC bulk cell in the logic cell to which the EC bulk cell is inserted. This separating operation is explained later.

Figure 7:
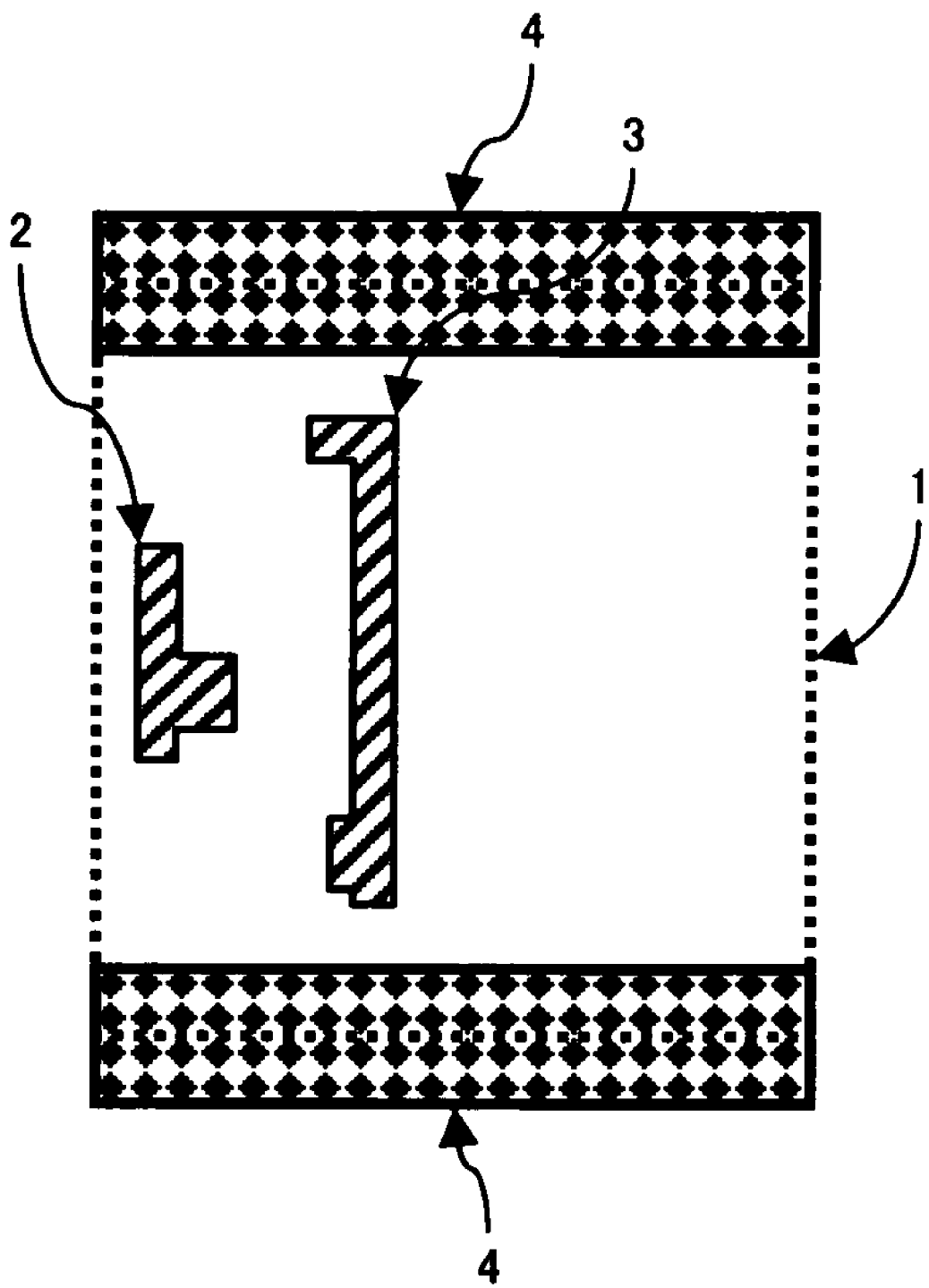
FIG. 7 is an explanatory diagram of an example in which AND operation is performed on terminal positions.

In the present embodiment, in order to make cells with the same logic and similar driving capability the same in size and same terminal position, cells with such characteristics can be newly generated; however, it is also possible to generate a redundant cell using the existing cells. In other words, a range of driving capability of the existing cells is separated into groups, and cell frames are generated so as to match the size of the largest cell in the group. Then, common parts of each terminal in all the cells are extracted, that is, for example, by extracting common parts of input terminal of all the cells, the cells, which can be replaced with, can be generated. Such extraction of common parts of all terminals is hereinafter referred to as performing AND operation. FIG. 7 indicates a result that the AND operation is performed on each terminal of the cell in FIG. 2 and the cell in FIG. 1b, for example. It is apparent that, as the result of AND operation, not only the part common in each of all terminals, but also a part in a particular cell only can be included.

Figure 8:
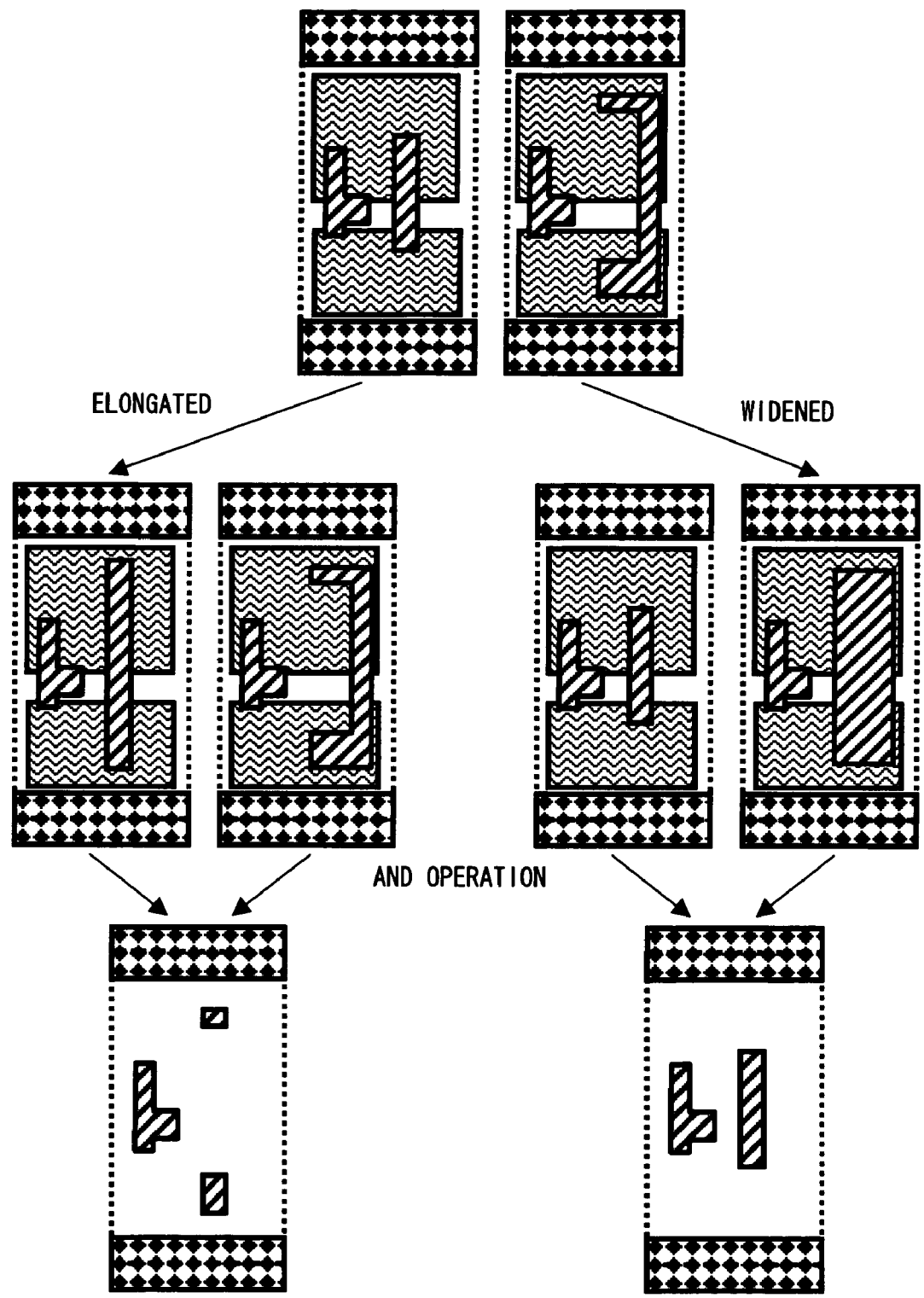
FIG. 8 is an explanatory diagram of an example of an enlarged terminal shape for performing AND operation on terminal positions.

In a case of generating a cell frame so as to match the size of the largest cell in a group and performing an AND operation on all terminals as explained above, it is possible to perform the AND operation after enlarging or elongating the shape of the terminals of the existing cell for the purpose of facilitating the AND operation. FIG. 8 is an explanatory diagram of such change in shapes of terminals. By performing the AND operation on the results of elongated shape or widened shape of the terminals indicated on top of FIG. 8, the terminal shape as common parts can be extracted as indicated on bottom of FIG. 8.

Figure 9:
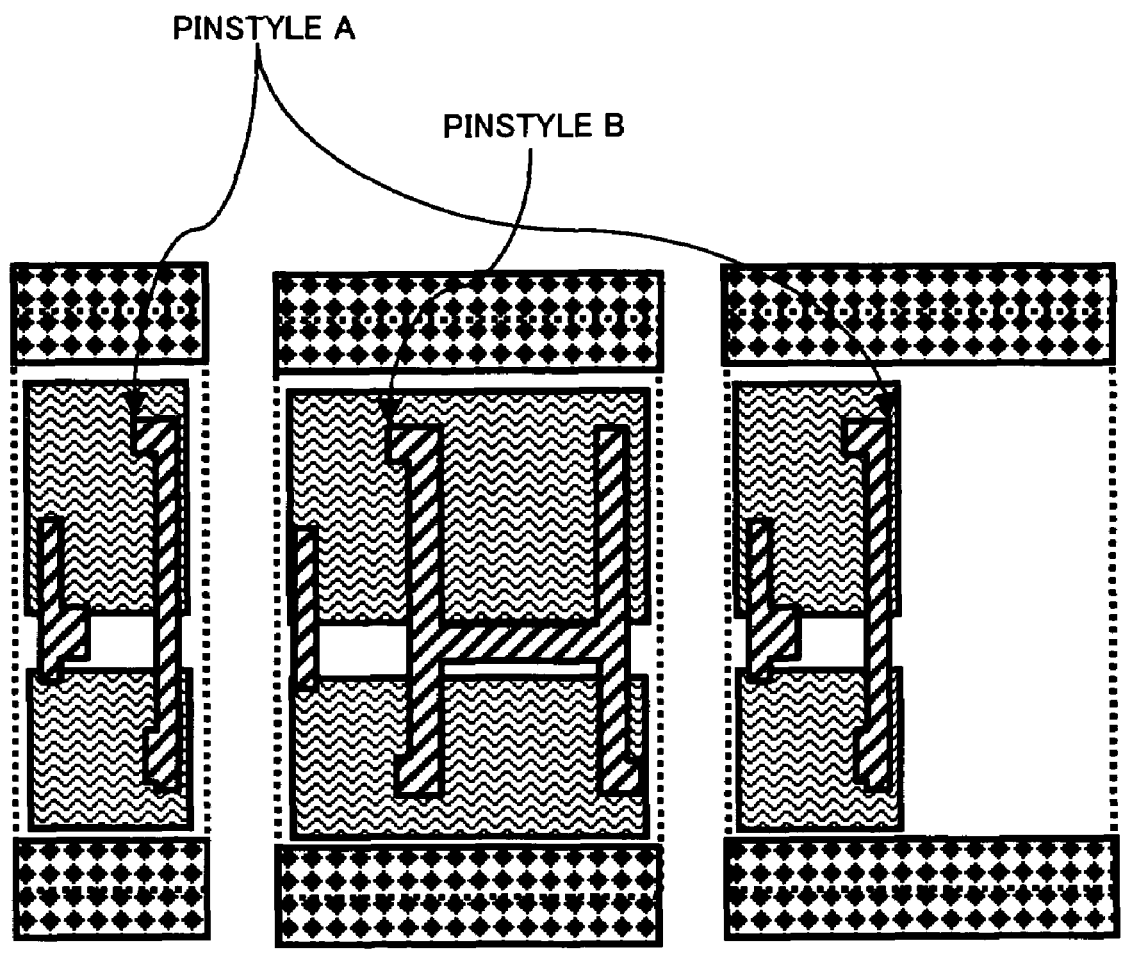
FIG. 9 is an explanatory diagram indicating a pinstyle cell terminal shape.

Next, in the present embodiment, the above shapes and positions of terminals are indicated as a pinstyle. FIG. 9 is an explanatory diagram of relation between the pinstyle (its flag) and terminal shapes. FIG. 9 is, for example, a diagram explaining a pinstyle as flags showing terminal shape of an output terminal and its position (close to the left). Cell size of the cell on the right and the cell on the left are different; however, the shape and position (close to the left) of the output terminal is represented by the same "pinstyle A". The output terminal in a cell in the middle is represented by "pinstyle B" for it has different shape from the pinstyle A.

In the following description, explanations of a practical example of a cell name in making the cell size and terminal shape the same between cells with similar driving capability, and of a cell library indicating that the cells have the same cell size and terminal shape are provided. First, as for the cell name, the following is an expression of a new cell name of an example of a cell name containing information of what terminal shape the cell has in addition to the cell size. {Original cell name 1}+{PA}, where PA is an abbreviation of "pinstyle A".

By having the new cell name contain the original cell name as a base cell name and pinstyle data, the new cell can contain information of what shape the terminal has and at what position the terminal is. If the pistyle A contains cell frame (cell size) information, unlike FIG. 9, it is clear that which existing cell can be used as a new cell with which cell size and what terminal shape and position, by causing the new cell name to have the cell name of the original cell name 1+the pinstyle A.

FIG. 10 through FIG. 12 are explanatory diagrams of a library containing the new cell information. In FIG. 10, "new cell name 1" which is independent of the existing original cell name, the size of "XXXYYY" corresponding the width of the largest cell in the above-explained group, the pinstyle in the cell frame, that is "pinstyle A" indicating the shape of each terminal and the position which is close to the left, for example, and names and coordinates of each terminal such as an input terminal, an output terminal and a power terminal are stored as library data. Here, "pinstyle A" can be defined by each terminal in a cell, or all terminal shapes and cell sizes can be defined collectively as one pinstyle as explained above. When positions of terminals are represented by "pinstyle A", coordinates of each input terminal are not necessary.

FIG. 11 is a different representation of cell library. In the library, in addition to a new cell name and its size, names and coordinates of each terminal are stored. In this library, pinstyle data indicating terminals of the cell and shapes etc. is described on another list.

FIG. 12 is an explanatory diagram of terminal shape table storing pinstyle data corresponding to FIG. 11. In the table, pinstyle data indicating shapes and positions of the terminal in the cell corresponding to each cell name of new cells.

An explanation of cell name indicating inserted cells and library representation, when interelectrode capacitance cell or EC bulk cell is inserted in a redundant region, as described above, is provided in the following description. As for the cell name, first, information of which original cell, or the existing cell, and of which EC bulk cell, for example, is contained in the cell frame generated so as to match the largest-sized cell in the group is represented in the cell name as in the following example. {original cell name}+{BA}, where BA is an abbreviation of "bulk cell A".

In other words, in the cell name of the new cell contains a cell of original cell name 1 as the existing cell and an EC bulk cell A.

FIG. 13 is an example of a cell library indicating other cells are inserted in the redundant region. In this example, compared with FIG. 10, DIVCELL data, indicating what kind of two cells this new cell will be separated into, is stored after cell size. That is, it indicates that, by separating the cell, the separated cells can be replaced with the cells of the original cell name 1 and of the EC bulk cell A, and, when separated, coordinates of each cell are also indicated. If cells were to be arranged so that they are moved over to the left in the cell frame, the arrangement coordinate can be omitted. If the original cell name 1 is included in the new cell name as explained above, as data corresponding to the DIVCELL, bulk cell A and its coordinate alone can be indicated, omitting the original cell name 1 and it's coordinate.

FIG. 14 is an explanatory diagram of another different representation of cell library. This figure indicates the contents of the library when DIVCELL data as cell separation information is not stored in the cell library but in another table.

FIG. 15 is an example of table of cell after separation as cell separation information corresponding to FIG. 14. For each new cell name, the original cell name and, for example, EC bulk cell name are stored in an appropriate format when the cell is separated.

In the above explanation of FIG. 10 through FIG. 15, a representation indicating a cell name, and cell size, terminal shape and position as a cell library and a representation of data of the cell inserted in a redundant region are explained separately; however it is obvious that these two representations should be combined when indicating both data of cell size, terminal shape and position and data of inserted cell.

Figure 16:
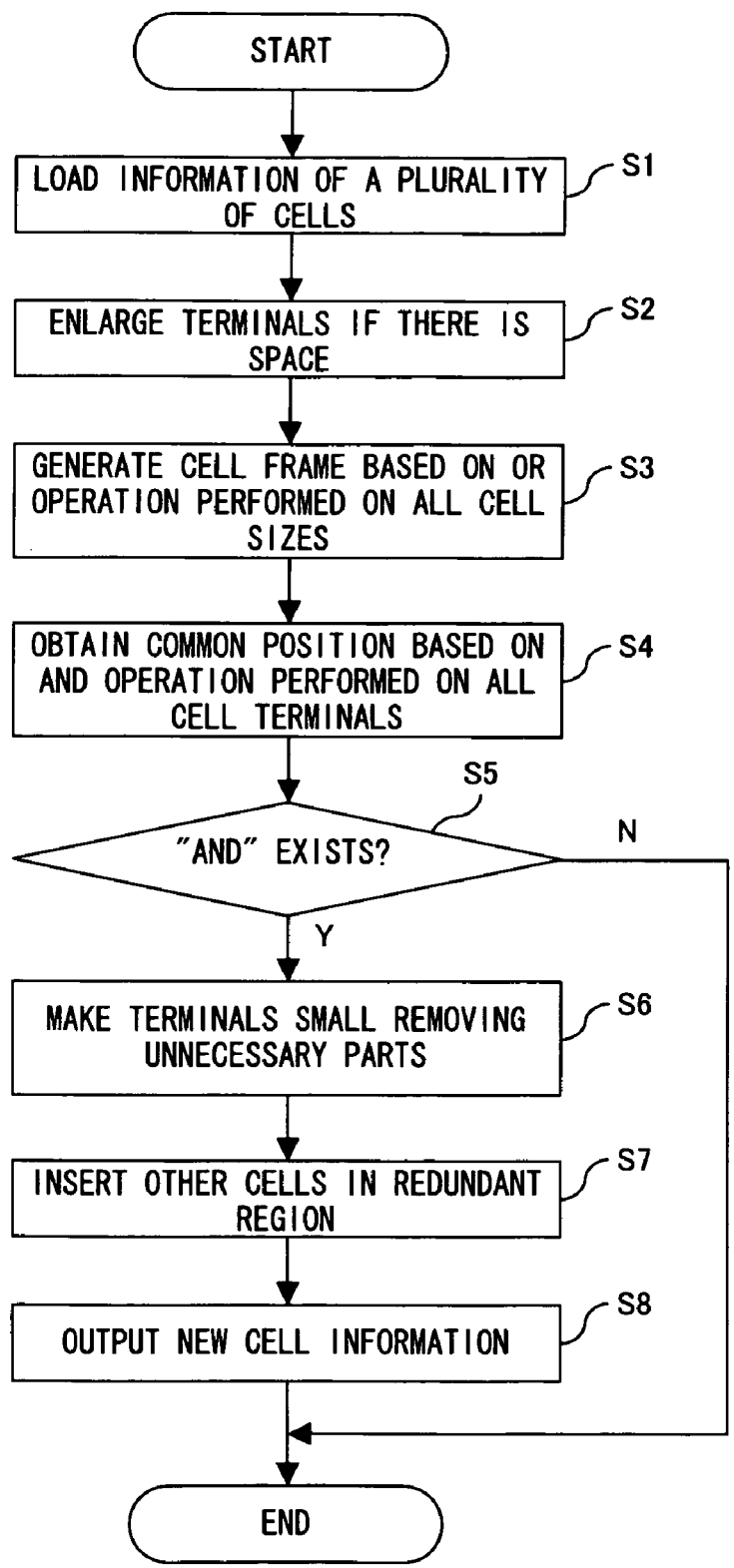
FIG. 16 is a flowchart of cell frame standardization process.

In the following description, processing for making cell size and terminal shapes etc. the same by CAD, for example, in the present embodiment is set forth. FIG. 16 is a flowchart of a cell frame standardization process. In the process, standardization process of cell size, terminal shape and terminal position corresponding to the above one group is explained.

Once the process is started in FIG. 16, first, information of a plurality of cells in the group, for example layout information, is loaded in step S1, the size of the terminal is enlarged in order to facilitate the AND operation of terminal shape as described above when there is space in regions within each cell in step S2, and a cell frame is generated so as to match the largest cell size among all the cells in step S3. Here, matching of cell size to the largest cell means to perform OR operation on all cell sizes.

Figure 17:
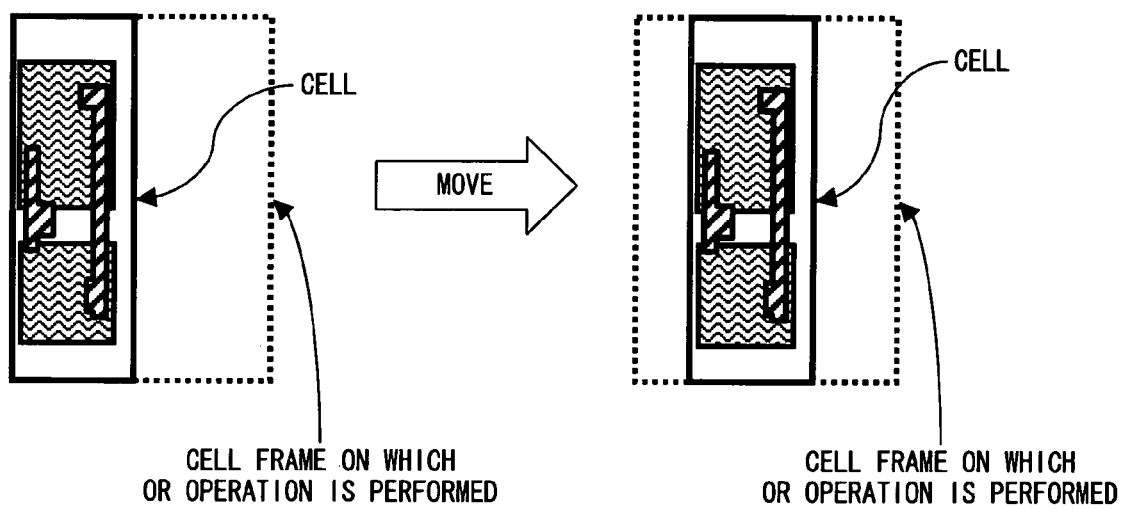
FIG. 17 is an explanatory diagram of terminal coordinate standardization by moving cells in a cell frame.

In step S4, as explained in FIG. 7 and FIG. 8, AND operation is performed on terminals, and a common terminal shape and its position are output. In such a case, as shown in FIG. 17, AND operation can be performed on terminal positions by moving a cell within a cell frame generated in step S3. In such a case, it is clear that a coordinate of the terminal position is required in the above-explained library, for example.

Next, in step S5, whether the AND operation is performed on terminal shapes and positions or not is determined, and if the AND operation cannot be operated the process is immediately terminated. If the AND operation is performed on terminal shapes and positions for all cells, in step S6, terminals are made smaller by removing an unnecessary part in the terminals enlarged in step S2, and other cells such as EC bulk cells are inserted in an empty region (redundant region), and in step S8, information of a new cell, such as the cell name explained above and cell library information, is output and the process is terminated. The process of step S6 can be omitted, and also, if the AND operation cannot be performed on terminal shapes and terminal positions for all cells in a group in step S5, processes from step S6 to step S8 can be carried out for only cells on which the AND operation was performed.

Figure 18:
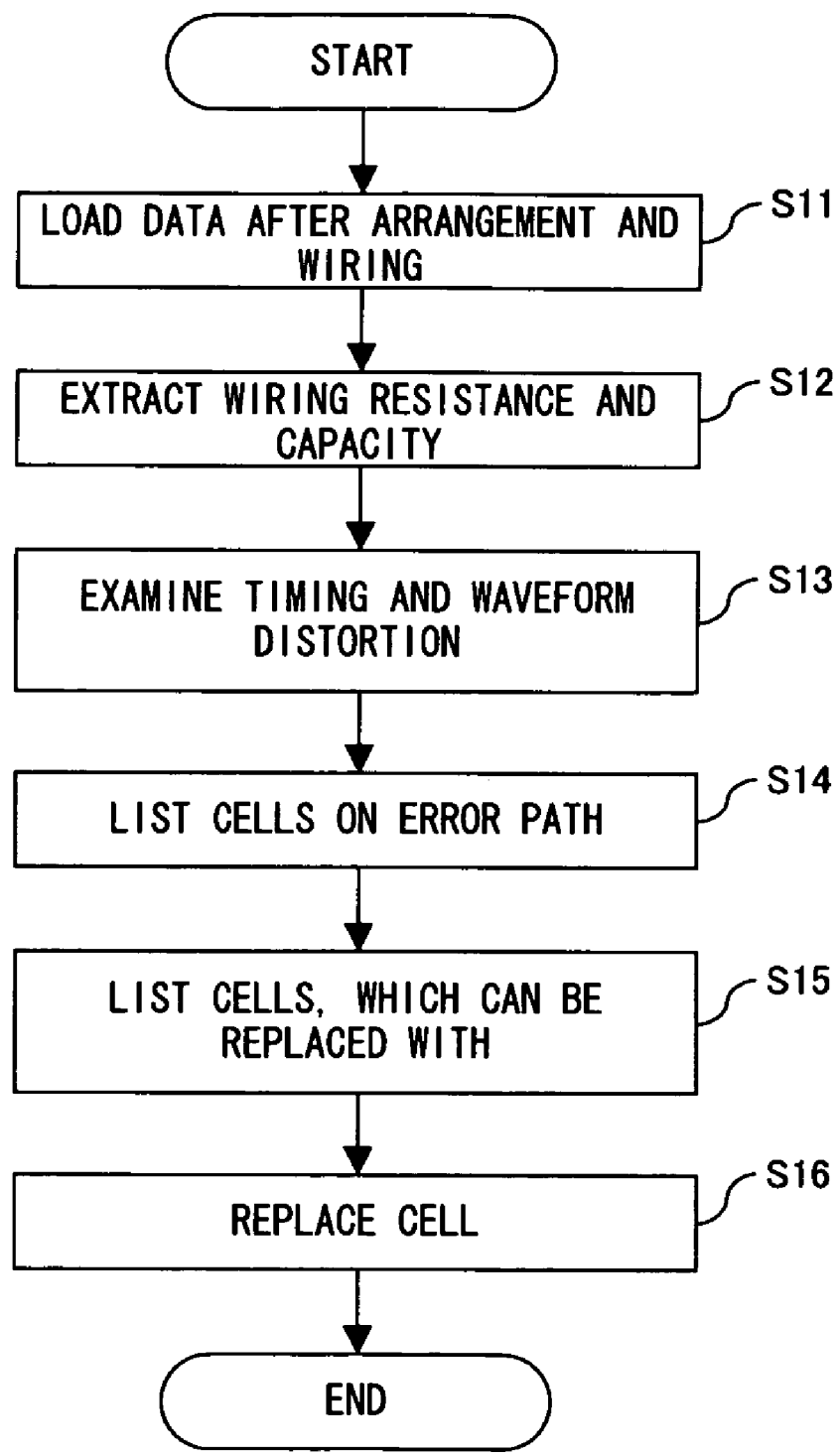
FIG. 18 is a flowchart of cell replacement process.

FIG. 18 is a flowchart of cell replacement process in cell layout. Once the process is started in FIG. 18, first, after layout, cell arrangement data and wiring data are loaded in step S11, extraction of wiring resistance and wiring capacitance is carried out in step S12, and timing examination and waveform distortion examination is carried out in step S13.

As a result of these examinations, if there is no problem, the process is terminated at this point. The extraction process of wiring resistance etc. in step S12 can be omitted.

As a result of examination in step S13, when an error is detected, cells of the path where the error is detected are listed in step S14, and cells, which can be replaced with and are expected to resolve the error, or generally cells with larger driving capability, are listed in step S15, the cell is replaced in step S16, and the process is terminated. Such process is basically the same as the conventional process; however in the conventional process, because wiring modification is performed after replacement of the cell, repetition of process after step S12 is required.

Figure 19:
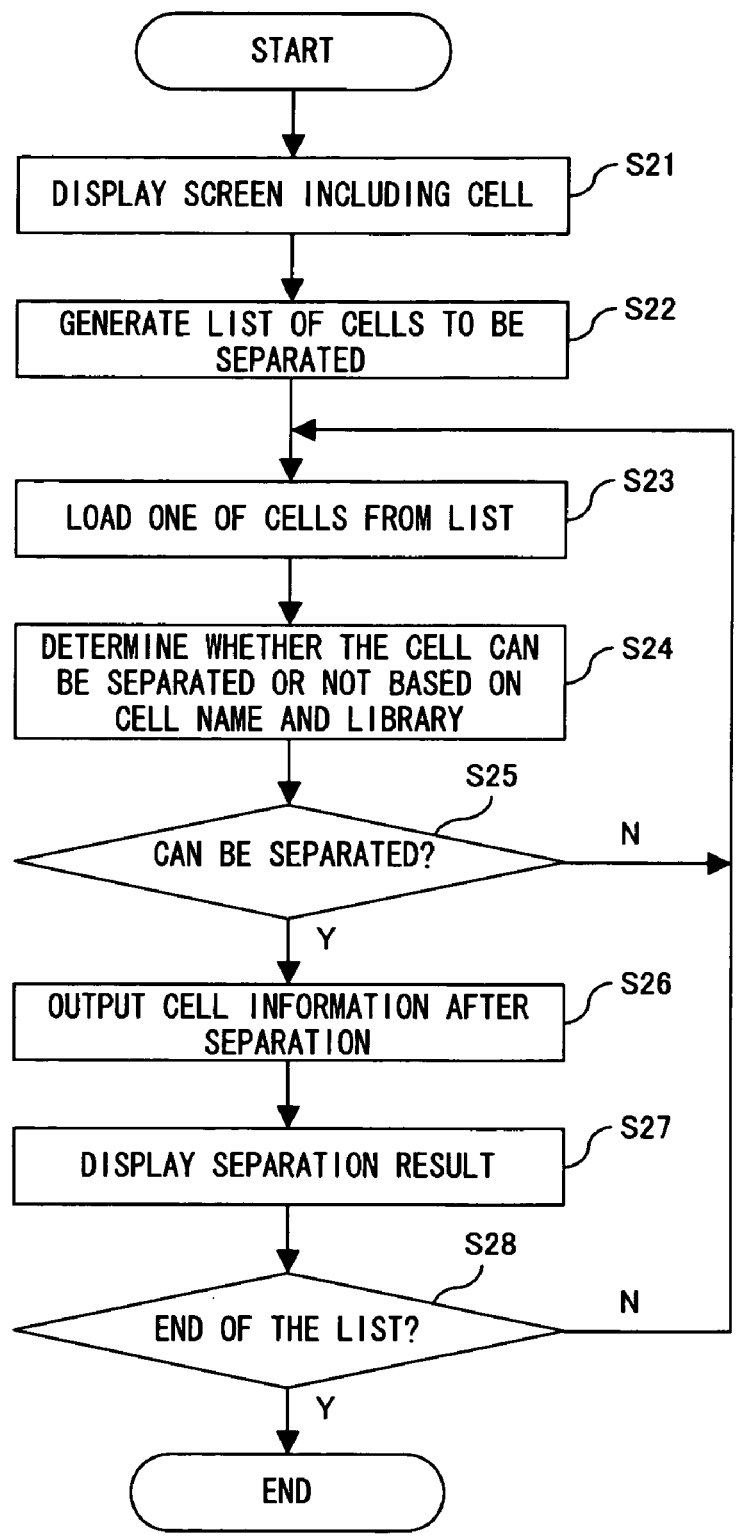
FIG. 19 is a flowchart of cell separation process.

FIG. 19 is a flowchart of cell separation process. In the process, in order to actually use the EC bulk cell or capacitance cell between power sources inserted in a redundant region as explained above, process for outputting new cell information after separating the cell is carried out.

Figure 20:
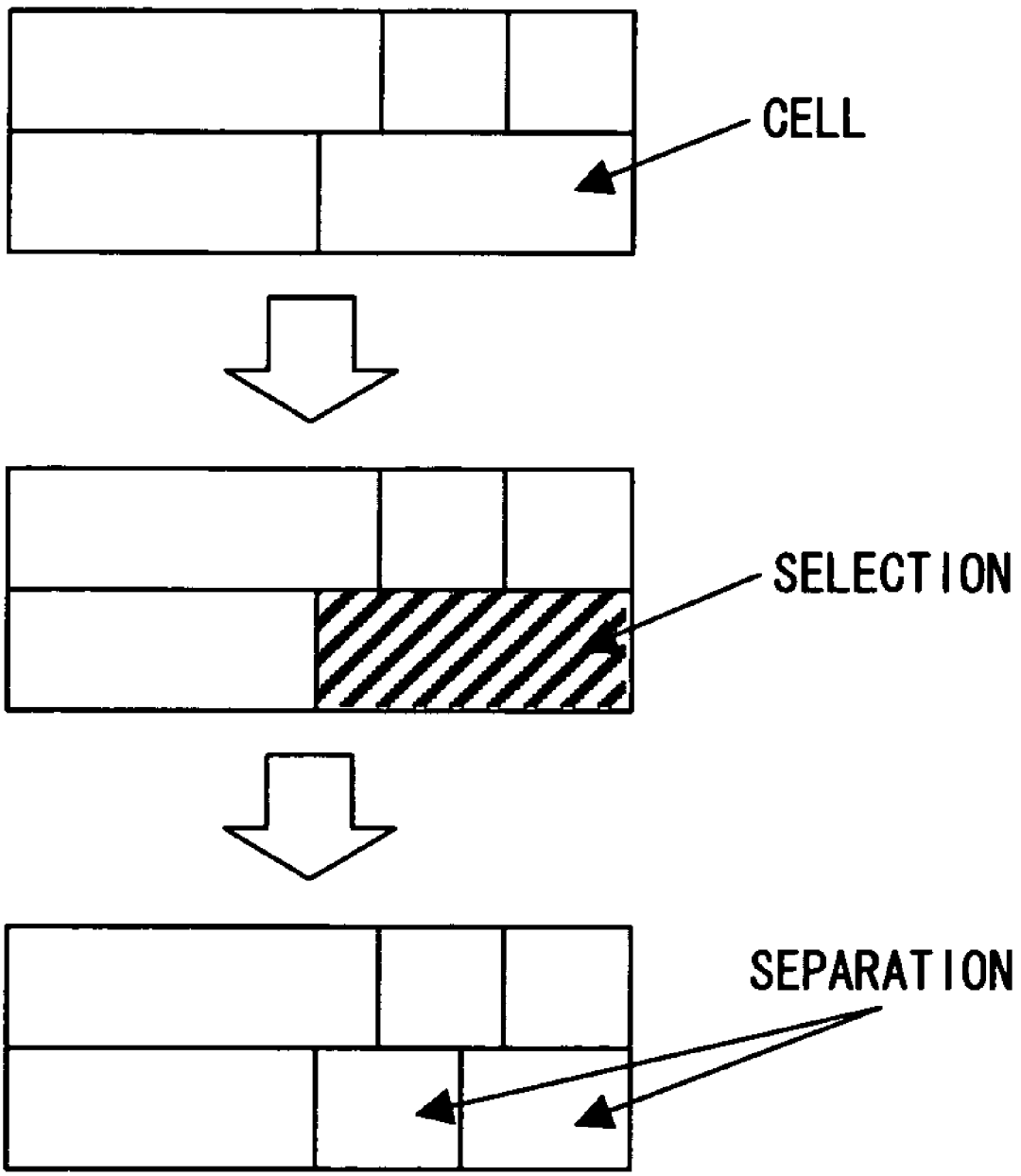
FIG. 20 is an explanatory diagram of screen display in cell separation process.

Once the process is started in FIG. 19, display of screen including cells is performed in step S21. Here, an explanation of the process is provided under assumption of the use of a graphical user interface (GUI) As a result of step S21, the screen described on top of FIG. 20 is displayed. This screen display includes the cell.

In subsequent step S22, as shown in the middle of FIG. 20, the cell to be separated is selected on the screen, a list of the cells is created if a plurality of cells are to be separated, and the process of step S23 through step S28 is carried out for each of the cells on the list.

In step S23, one cell from the cell list is loaded, in step S24, whether the cell can be separated or not is determined from the cell name and library data, and in step S25, process after step S23 is repeated when the cell cannot be separated.

When it is determined that the cell can be separated, in step S25, cell information after separation of the cell is output in step S26, in step S27, as shown in the bottom of FIG. 20, separation result is displayed. In step S28, whether it is the end of the list of cells to be separated or not is determined, when it is not the end, process after step S23 is repeated, and when it is determined to be the end of the list, the process is terminated.

Figure 21:
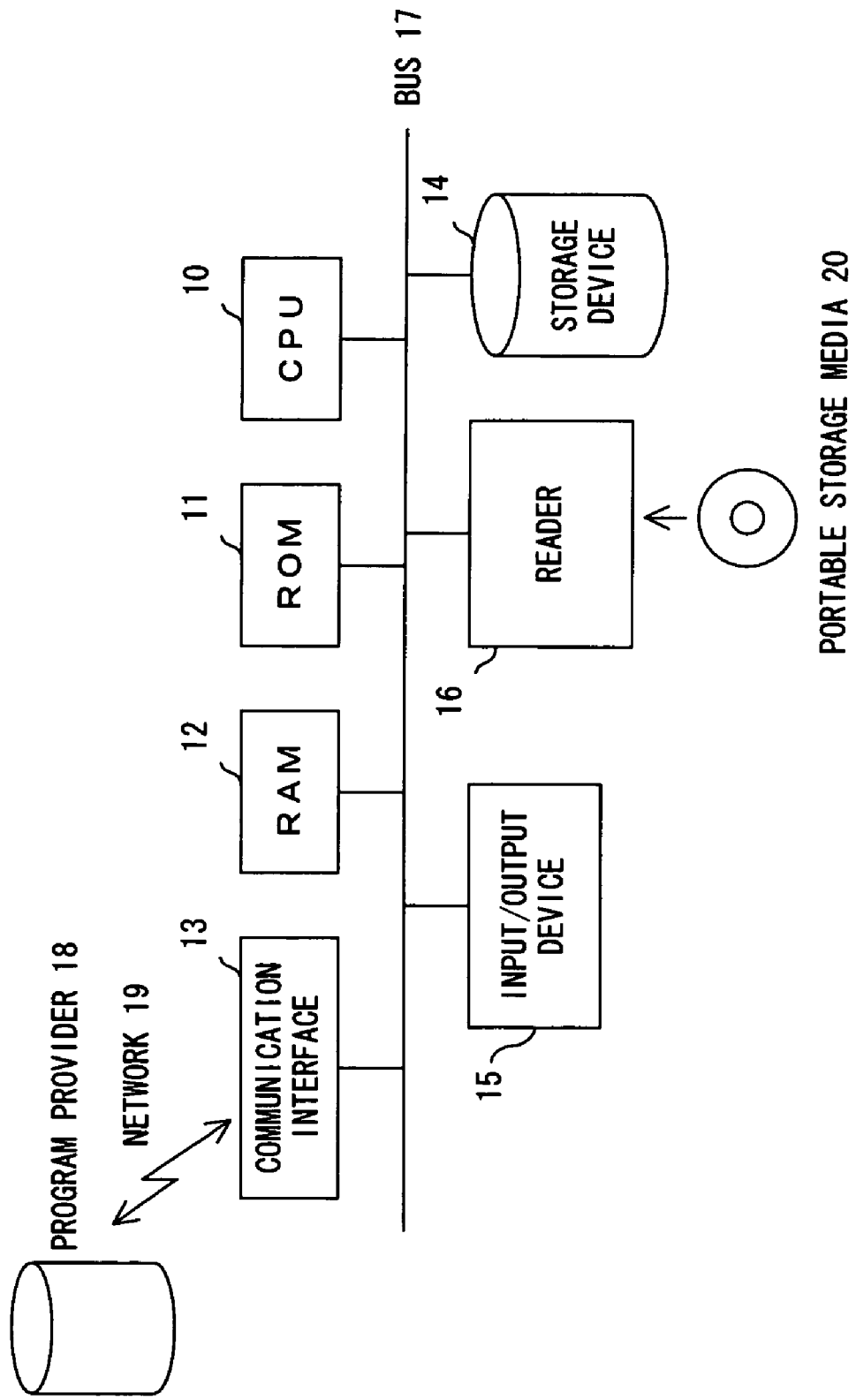
FIG. 21 is a diagram explaining loading of program for realizing the present invention on a computer.

The detailed explanation of process of the cell frame standardizing program of the present invention is provided above. It is possible that the CAD processing including the execution of the program can be obviously performed by commonly used computer systems. FIG. 21 is a structural block diagram, of such a computer system, or hardware environment.

In FIG. 21, the computer system comprises a central processing unit (CPU) 10, read-only memory (ROM) 11, random access memory (RAM) 12, a communication interface 13, a storage device 14, an input/output device 15, portable storage media reader 16, and a bus 17 connecting all of these elements.

As for the storage device 14, various types of storage devices such as hard disks and magnetic disks can be used, and a program indicated in flowcharts in FIG. 16, FIG. 18, and FIG. 19 and a program in claim 9 of the present invention are stored in such a storage device 14 and the ROM 11. By executing the programs by the CPU 10, the cell frame standardization process, cell replacement process and cell separation process in the present embodiment can be performed.

Such a program can be stored in, for example, the storage device 14 from a program provider 18 via a network 19 and the communication interface 13. Also, it can be stored in a commercially manufactured, and stored in distributed portable storage media 20, set in the reader 16, and can be executed by the CPU 10. As for the portable storage media 20, various types of storage media such as CD-ROM, flexible disks, optical disks, magnet-optical disks, DVD, can be used, and by reading a program stored in such a storage media by the reader-16, the cell frame standardizing process etc. in the present embodiment can be realized.

What is claimed is:

1. A layout method of a semiconductor integrated circuit, where cells are arranged on a substrate, comprising:
    an arrangement process for arranging the cells on the substrate based on cell layout information which is composed of a plurality of same logic cells with similar driving capability, same-sized cell frame and terminals at same positions;
    a wiring process for generating wiring to connect between arranged cells;
    an extraction process for extracting wiring resistance and/or wiring capacitance of a path between the cells based on wiring layout information obtained in the wiring process;
    a timing examination process for examining timing of the path between the cells based on the values of the wiring resistance and/or wiring capacitance; and
    a cell replacement process for replacing cells, corresponding to a path determined to be an error in the timing examination process, with other same logic cells comprising terminals at the same positions as those in a cell frame with the same size, and different driving capability, and
    wherein other cells are arranged in a redundant region in a cell frame of a cell with low driving capability among a plurality of the cells with the same logic and similar driving capability.

2. The layout method of a semiconductor integrated circuit according to claim 1, wherein a plurality of the cells with similar driving capability are three cells: one cell; a cell with a driving capability one increment lower than said one cell; and a cell with a driving capability one increment higher than said one cell.

3. The layout method of a semiconductor integrated circuit according to claim 1, wherein a plurality of the cells with similar driving capability are cells in a group resulted from grouping the cells with the same logic loaded on the semiconductor integrated circuit into a plurality of groups according to their driving capability.

4. The layout method of a semiconductor integrated circuit according to claim 1, wherein a cell with a smallest cell frame of cells in each driving capability can be used as a cell arranged on the substrate in addition to a cell with the same terminal position in a same-sized cell frame among cells with similar driving capability.

5. The layout method of a semiconductor integrated circuit according to claim 1, wherein said other cell is a cell for generating capacitance between power sources.

6. The layout method of a semiconductor integrated circuit according to claim 1, wherein said other cell is a bulk cell used for modification after cell arrangement.

7. The layout method of a semiconductor integrated circuit according to claim 1, wherein a plurality of the cells with the same logic and the similar driving capability have cell names indicating that cell frames of those cells are the same in size and positions of terminals are the same.

8. The layout method of a semiconductor integrated circuit according to claim 1, wherein a plurality of the cells with the same logic and the similar driving capability comprise the same cell frame as that of the cell with the largest cell frame size among a plurality of cells with similar driving capability.

9. The layout method of a semiconductor integrated circuit according to claim 1, wherein a plurality of the cells with the same logic and the similar driving capability comprise a position where shape of the terminals of each cell with similar driving capability overlaps each other, as the same terminal position.

10. The layout method of a semiconductor integrated circuit according to claim 9, wherein a plurality of the cells with the same logic and similar driving capability comprises a terminal shape of redundant size in order to enlarge overlapping area of terminal shape of each cell.

* * * * *